United States Patent
Kim et al.

(10) Patent No.: US 10,725,217 B2
(45) Date of Patent: Jul. 28, 2020

(54) COMPENSATION FILM AND ANTIREFLECTIVE FILM AND DISPLAY DEVICE

(71) Applicant: SAMSUNG ELECTRONICS CO., LTD., Suwon-si (KR)

(72) Inventors: Ju Hyun Kim, Anyang-si (KR); Hyunseok Choi, Anyang-si (KR); Sangah Gam, Seoul (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 580 days.

(21) Appl. No.: 15/581,910

(22) Filed: Apr. 28, 2017

(65) Prior Publication Data
US 2018/0149784 A1    May 31, 2018

(30) Foreign Application Priority Data
Nov. 30, 2016   (KR) .................. 10-2016-0162276

(51) Int. Cl.
*G02B 5/30* (2006.01)
*G02F 1/13363* (2006.01)
(Continued)

(52) U.S. Cl.
CPC ....... *G02B 5/3016* (2013.01); *G02F 1/13363* (2013.01); *G02F 1/133502* (2013.01);
(Continued)

(58) Field of Classification Search
CPC ... G02B 5/3016; G02B 5/30; G02F 1/133502; G02F 1/13363; G02F 1/133632;
(Continued)

(56) References Cited

U.S. PATENT DOCUMENTS

| 2005/0195348 A1* | 9/2005 | Saitoh | G02B 5/3083 349/118 |
| 2009/0033839 A1* | 2/2009 | Fukuda | C09K 19/348 349/102 |

(Continued)

FOREIGN PATENT DOCUMENTS

| JP | 4074762 | 4/2008 |
| JP | 2015161714 | 9/2015 |

(Continued)

OTHER PUBLICATIONS

Machine translation of Sone et al., JP 2015161714 A (Year: 2015).*
(Continued)

*Primary Examiner* — William R Alexander
*Assistant Examiner* — Balram T Parbadia
(74) *Attorney, Agent, or Firm* — Cantor Colburn LLP (57) ABSTRACT

A compensation film satisfies Inequalities 1 and 2, and an antireflective film and a display device are provided with the compensation film.

$$0.90 \leq \frac{R_e(\theta°) + R_e(-\theta°)}{2R_e(0°)} \leq 1.20, \quad \text{[Inequality 1]}$$

where, in Inequality 1,
$R_e(\theta°)$ is in-plane retardation of the compensation film in respective tilting direction at $\theta°$ with respect to the direction perpendicular to the optical axis of the compensation film, and $$R_e(450 \text{ nm}) < R_e(550 \text{ nm}) < R_e(650 \text{ nm}), \quad \text{[Inequality 2]}$$

where, in Inequality 2,
$R_e$ (450 nm), $R_e$ (550 nm) and $R_e$ (650 nm) are in-plane retardation of the compensation film in the direction
(Continued)

perpendicular to the optical axis of the compensation film for incident light having a wavelength of 450 nanometers, 550 nanometers and 650 nanometers, respectively.

10 Claims, 6 Drawing Sheets

(51) Int. Cl.
    *G02F 1/1335*     (2006.01)
    *H01L 51/52*     (2006.01)

(52) U.S. Cl.
    CPC .. *G02F 1/133632* (2013.01); *G02F 1/133634* (2013.01); *H01L 51/5284* (2013.01); *G02F 2001/133633* (2013.01); *G02F 2001/133637* (2013.01); *G02F 2001/133638* (2013.01); *G02F 2203/05* (2013.01); *G02F 2413/02* (2013.01); *G02F 2413/06* (2013.01); *G02F 2413/08* (2013.01); *G02F 2413/105* (2013.01)

(58) Field of Classification Search
    CPC ..... G02F 1/13364; G02F 2001/133633; G02F 2001/133637; G02F 2001/133638; G02F 2203/05; G02F 2413/02; G02F 2413/06; G02F 2413/08; G02F 2413/105; G02F 1/1335; H01L 51/5284; H01L 51/52
See application file for complete search history.

(56) References Cited

U.S. PATENT DOCUMENTS

| | | | |
|---|---|---|---|
| 2011/0128473 A1* | 6/2011 | Ishiguro | G02F 1/133634 349/68 |
| 2012/0146482 A1* | 6/2012 | Yeom | B32B 17/10018 313/112 |
| 2012/0300160 A1* | 11/2012 | Lee | G02B 3/005 349/106 |
| 2014/0205822 A1 | 7/2014 | Wang et al. | |
| 2015/0369981 A1 | 12/2015 | Takeda et al. | |
| 2016/0161785 A1 | 6/2016 | Kamada et al. | |

FOREIGN PATENT DOCUMENTS

| | | |
|---|---|---|
| JP | 2016511839 | 4/2016 |
| KR | 1020150104175 | 9/2015 |
| KR | 101636189 | 7/2016 |

OTHER PUBLICATIONS

Extended European Search Report—European Patent Application No. 17202165.1 dated May 7, 2018, citing references listed within.

* cited by examiner

COMPENSATION FILM AND ANTIREFLECTIVE FILM AND DISPLAY DEVICE

CROSS-REFERENCE TO RELATED APPLICATION

This application claims priority to Korean Patent Application No. 10-2016-0162276, filed on Nov. 30, 2016, and all the benefits accruing therefrom under 35 U.S.C. § 119, the content of which in its entirety is herein incorporated by reference.

BACKGROUND

1. Field

Embodiments of a compensation film, an antireflective film, and a display device are disclosed.

2. Description of the Related Art

Flat panel displays may be classified into a light-emitting display device emitting light by itself and a non-emissive display device desiring a separate light source, and a compensation film is frequently employed for improving image quality thereof.

However, since a currently-developed compensation film has strong wavelength dependency and viewing angle dependency, visibility may be decreased.

Accordingly, a method of laminating two or more compensation films is suggested.

SUMMARY

In a method of laminating two or more compensation films, a compensation film becomes thicker, a manufacturing process is added, and a compensation function may be deteriorated by a deviation of optical properties and lamination error in a plurality of layers.

An embodiment provides a compensation film which reinforces a compensation function due to reduction of wavelength dependency and viewing angle dependency while decreasing a thickness without a further process.

Another embodiment provides an antireflective film including the compensation film.

Yet another embodiment provides a display device including the compensation film or the antireflective film.

According to an embodiment, a compensation film satisfying Inequalities 1 and 2 is provided.

$$0.90 \leq \frac{R_e(\theta°) + R_e(-\theta°)}{2R_e(0°)} \leq 1.20 \qquad \text{[Inequality 1]}$$

In Inequality 1, $R_e$ (0°) is in-plane retardation of the compensation film in a direction perpendicular to an optical axis of the compensation film for incident light having a wavelength of 550 nanometers (nm), $R_e$ (θ°) and $R_e$ (−θ°) are in-plane retardation of the compensation film in respective tilting directions at θ° and −θ° with respect to the direction perpendicular to the optical axis of the compensation film for the incident light having the wavelength of 550 nm, where θ° ranges from about 10° to about 60°, and $R_e$ (θ°) and $R_e$ (−θ°) are different from each other, $$R_e(450\text{ nm}) < R_e(550\text{ nm}) < R_e(650\text{ nm}) \qquad \text{[Inequality 2]}$$

In Inequality 2, $R_e$ (450 nm) is in-plane retardation of the compensation film in the direction perpendicular to the optical axis of the compensation film for incident light having a wavelength of 450 nm, $R_e$ (550 nm) is in-plane retardation of the compensation film in the direction perpendicular to the optical axis of the compensation film for the incident light having the wavelength of 550 nm, and $R_e$ (650 nm) is in-plane retardation of the compensation film in the direction perpendicular to the optical axis of the compensation film for incident light having a wavelength of 650 nm.

In an embodiment, the compensation film may satisfy Inequality 3.

$$|R_e(\theta°) - R_e(-\theta°)| > 10 \text{ nm} \qquad \text{[Inequality 3]}$$

In Inequality 3, $R_e$ (θ°) and $R_e$ (−θ°) are in-plane retardation of the compensation film in respective tilting directions at θ° and −θ° with respect to the direction perpendicular to the optical axis of the compensation film for the incident light having the wavelength of 550 nm, where θ° ranges from about 10° to about 60°.

In an embodiment, Inequality 1 may be represented by Inequality 1a.

$$1.00 \leq \frac{R_e(\theta°) + R_e(-\theta°)}{2R_e(0°)} \leq 1.16 \qquad \text{[Inequality 1a]}$$

In Inequality 1a, $R_e$ (0°) is in-plane retardation of the compensation film in the direction perpendicular to the optical axis of the compensation film for the incident light having the wavelength of 550 nm, $R_e$ (θ°) and $R_e$ (−θ°) are in-plane retardation of the compensation film in respective tilting directions at θ° and −θ° with respect to the direction perpendicular to the optical axis of the compensation film for the incident light having the wavelength of 550 nm, where θ° ranges from about 10° to about 60°, and $R_e$ (θ°) and $R_e$ (−θ°) are different from each other, In an embodiment, the in-plane retardation of the compensation film for the light having the wavelengths of 450 nm and 550 nm may satisfy Inequality 2a.

$$0.70 \leq R_e(450\text{ nm})/R_e(550\text{ nm}) < 1.00 \qquad \text{[Inequality 2a]}$$

In Inequality 2a, $R_e$ (450 nm) is in-plane retardation of the compensation film in the direction perpendicular to the optical axis of the compensation film for the incident light having the wavelength of 450 nm, and $R_e$ (550 nm) is in-plane retardation of the compensation film in the direction perpendicular to the optical axis of the compensation film for the incident light having the wavelength of 550 nm.

In an embodiment, the in-plane retardation of the compensation film for the light having the wavelengths of 550 nm and 650 nm may satisfy Inequality 2b.

$$1.00 < R_e(650\text{ nm})/R_e(550\text{ nm}) \leq 1.50 \qquad \text{[Inequality 2b]}$$

In Inequality 2b, $R_e$ (550 nm) is in-plane retardation of the compensation film in the direction perpendicular to the optical axis of the compensation film for the incident light having the wavelength of 550 nm, and $R_e$ (650 nm) is in-plane retardation of the compensation film in the direction perpendicular to the optical axis of the compensation film for the incident light having the wavelength of 650 nm.

In an embodiment, θ° of Inequality 1 may range from about 45° to about 60°.

In an embodiment, $R_e$ (0°) of Inequality 1 may range from about 120 nm to about 160 nm.

In an embodiment, a color shift measured in a 60° tilting side direction with reference to a front of the compensation film may be less than or equal to about 6.0.

In an embodiment, the compensation film may include an optical anisotropic layer and the optical anisotropic layer may consist of one of a single liquid crystal layer and a single elongated polymer layer.

According to another embodiment, an antireflective film includes a polarizer and a compensation film on one surface of the polarizer, where the compensation film satisfies Inequalities 1 and 2.

In an embodiment, the compensation film may satisfy Inequality 3.

In an embodiment, Inequality 1 may satisfy Inequality 1a.

In an embodiment, the in-plane retardation of the compensation film for the light having the wavelengths of 450 nm and 550 nm may satisfy Inequality 2a.

In an embodiment, the in-plane retardation of the compensation film for the light having the wavelengths of 550 nm and 650 nm may satisfy Inequality 2b.

In an embodiment, θ° of Inequality 1 may range from about 45° to about 60°.

In an embodiment, $R_e$ (0°) of Inequality 1 may range from about 120 nm to about 160 nm.

In an embodiment, a color shift measured in a 60° tilting side direction with reference to a front of the antireflective film may be less than or equal to about 6.0.

In an embodiment, the compensation film may include an optical anisotropic layer and the optical anisotropic layer may consist of one of a single liquid crystal layer and a single elongated polymer layer.

According to another embodiment, a display device includes a display panel and the compensation film on one surface of the display panel.

According to another embodiment, a display device includes a display panel and the antireflective film on one surface of the display panel.

The display panel may be a liquid crystal panel or an organic light emitting diode panel.

A compensation function may be reinforced by decreasing wavelength dependency and viewing angle dependency while decreasing a thickness due to a single layered compensation film without a further process.

BRIEF DESCRIPTION OF THE DRAWINGS

The above and other embodiments, advantages and features of this disclosure will become more apparent by describing in further detail embodiments thereof with reference to the accompanying drawings, in which.

DETAILED DESCRIPTION

Hereinafter, embodiments will hereinafter be described in detail so that a person skilled in the art would understand. However, embodiments may be embodied in many different forms and is not construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this invention will be thorough and complete, and will fully convey the scope of the invention to those skilled in the art. Like reference numerals refer to like elements throughout.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Hereinafter, an optical film is described according to an embodiment is described with reference to drawings.

Figure 1:
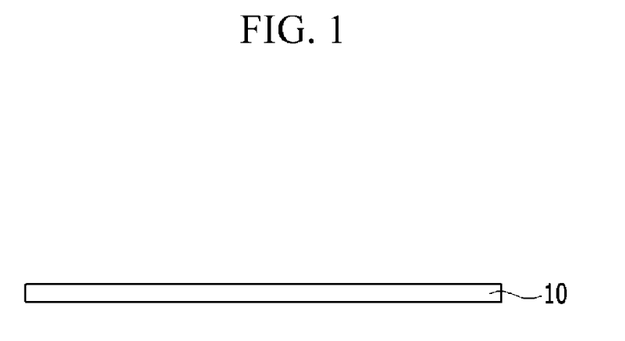
FIG. 1 is a cross-sectional view showing a compensation film according to an embodiment.
Figure 2:
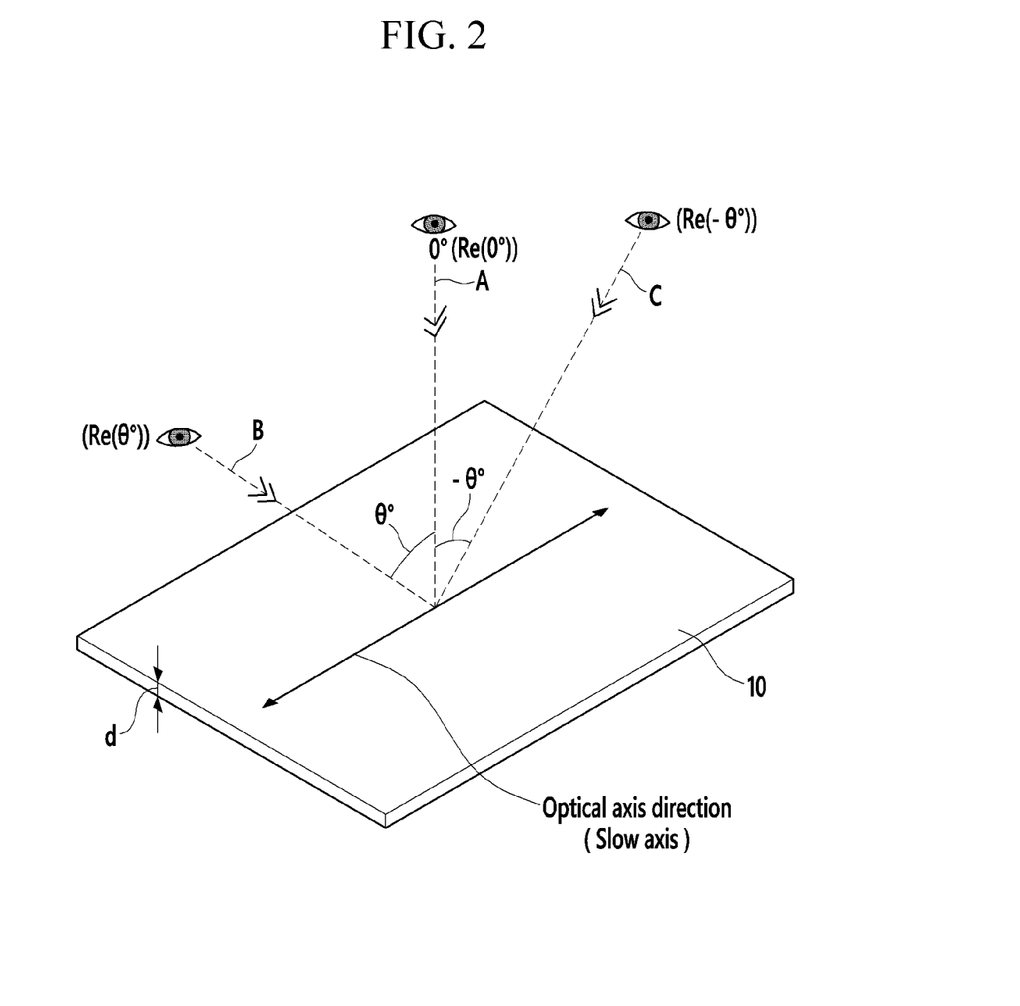
FIG. 2 is a view showing an examination position of the compensation film of FIG. 1.

FIG. 1 is a schematic cross-sectional view showing a compensation film according to an embodiment and FIG. 2 is a schematic view showing an examination position of the compensation film of FIG. 1.

The compensation film 10 may include or consist of a single optical anisotropic layer. In this way, the compensation film 10 may not only be realized as a thin compensation film but also prevent deviation of optical properties and a lamination error, which may be caused by a plurality of compensation films, and thus incurring deterioration of a compensation function. In an embodiment, the optical anisotropic layer may consist of, for example, a single liquid crystal layer or a single elongated polymer layer.

The compensation film 10 may further include an optical isotropic layer (not shown) such as a substrate. The optical isotropic layer may include a layer substantial optical isotropy having no substantial influence on retardation of the compensation film 10 and performing no optical compensation function other than a layer having ideal optical isotropy.

In an embodiment, the substrate of the compensation film 10 may be, for example, a glass substrate or a polymer substrate, and the polymer substrate may be, for example, a substrate including polyethylene terephthalate ("PET"), triacetyl cellulose ("TAC"), a derivative thereof, and/or a combination thereof, but is not limited thereto. In another embodiment, the substrate may be omitted.

When the compensation film 10 includes a single liquid crystal layer as an optical anisotropic layer, an alignment layer may be further included on one surface of the liquid crystal layer. The alignment layer may be an optical isotropic layer. In an embodiment, the alignment layer may impart a pretilt angle to liquid crystals of the liquid crystal layer and thus control alignment of the liquid crystals, and for example, may include polyvinyl alcohol, polyolefin, polyamic acid, polyimide, or a combination thereof, for example. The surface of the alignment layer may have alignment capability of liquid crystals through a physical treatment such as rubbing at the surface or a photo-treatment such as photo-alignment.

In an embodiment, the single liquid crystal layer may include a reactive mesogenic liquid crystal, for example, at least one mesogenic moiety and at least one polymerizable functional group. In an embodiment, the reactive mesogenic liquid crystal may include at least one of, for example, a rod-shaped aromatic derivative having at least one polymerizable functional group, propylene glycol 1-methyl, propylene glycol 2-acetate, and a compound represented by $P^1$-$A^1$-$(Z^1$-$A^2)_n$-$P^2$ (where $P^1$ and $P^2$ independently include a polymerizable functional group such as acrylate, methacrylate, acryloyl, vinyl, vinyloxy, epoxy, or a combination thereof, $A^1$ and $A^2$ independently include 1,4-phenylene, a naphthalene-2,6-diyl group, or a combination thereof, $Z^1$ includes a single bond, —COO—, —OCO—, or a combination thereof, and n is 0, 1, or 2), but is not limited thereto. The single liquid crystal layer may include one or more kinds of liquid crystals.

The single elongated polymer layer may include a polymer having a positive or negative birefringence and may be elongated in a uniaxial or biaxial direction.

The compensation film 10 may circularly polarize incident light to generate retardation.

The retardation may be represented by in-plane retardation ($R_e$) and thickness direction retardation ($R_{th}$). The in-plane retardation ($R_e$) of the compensation film 10 is a retardation generated in in-plane of the compensation film 10 and may be represented by $R_e=(n_x-n_y)d$. The thickness direction retardation ($R_{th}$) of the compensation film 10 is a retardation generated in a thickness direction (i.e., a direction perpendicular to a plane of the compensation film 10) of the compensation film 10 and may be represented by $R_{th}=\{[(n_x+n_y)/2]-n_z\}d$. Herein, $n_x$ is a refractive index in a direction having a highest in-plane refractive index in a plane of the compensation film 10 (hereinafter, also referred to as a 'slow axis'), $n_y$ is a refractive index in a direction having a lowest in-plane refractive index in a plane of the compensation film 10 (hereinafter, also referred to as a 'fast axis'), $n_z$ is a refractive index in a direction perpendicular to the slow axis and the fast axis of the compensation film 10, and d is a thickness of the compensation film 10.

The compensation film 10 may have predetermined in-plane retardation ($R_e$) and thickness direction retardation ($R_{th}$) by changing the $n_x$, $n_y$, $n_z$, and/or the thickness (d).

In an embodiment, the compensation film 10 may have, for example, in-plane retardation ($R_e$) of about 120 nanometers (nm) to 160 nm in a front direction, and may be, for example, a λ/4 plate. Herein, the in-plane retardation ($R_e$) is based on incident light having a wavelength of 550 nm (also referred to as a 'reference wavelength') and a front direction of the compensation film 10 refers to a direction perpendicular to an optical axis of the compensation film 10. The optical axis of the compensation film 10 may be, for example, a slow axis of the compensation film 10.

The compensation film 10 may have different in-plane retardation ($R_e$) according to an examination direction.

When the compensation film 10 is designed to satisfy in-plane retardation ($R_e$) having predetermined relationships according to an observation direction, visibility deterioration in a side direction may be prevented by decreasing viewing angle dependency.

The compensation film 10 may satisfy, for example, Inequality 1.

$$0.90 \leq \frac{R_e(\theta°) + R_e(-\theta°)}{2R_e(0°)} \leq 1.20 \qquad \text{[Inequality 1]}$$

In Inequality 1, $R_e$ (0°) is in-plane retardation of the compensation film 10 in a direction perpendicular to an optical axis of the compensation film 10 for incident light having a wavelength of 550 nm, and $R_e$ (θ°) and $R_e$ (−θ°) are in-plane retardation of the compensation film 10 in respective tilting directions at θ° and −θ° with respect to a direction perpendicular to an optical axis of the compensation film for incident light having a wavelength of 550 nm.

Herein, θ° may range from about 10° to about 60°. In an embodiment, θ° may range from about 20° to about 60°, about 45° to about 60°, or about 50° to about 60°, for example.

Referring to FIG. 2, $R_e$ (θ°) is in-plane retardation of the compensation film 10 in a front direction (A) of the compensation film 10, that is, in a direction perpendicular to optical axis (e.g., a slow axis) of the compensation film 10, $R_e$ (θ°) is in-plane retardation of the compensation film 10 at a place where θ° is tilted with reference to the front direction (A) of the compensation film 10 and defines a first side direction (B), and $R_e$ (−θ°) is in-plane retardation of the compensation film 10 at a place where −θ° is tilted with reference to the front direction (A) of the compensation film 10 and defines a second side direction (C). Herein, the first side direction (B) and the second side direction (C) may be a symmetrical direction with a reference to the front direction (A).

In an embodiment, when θ° is 10°, for example, the first side direction (B) and the second side direction (C) may have respective tilting directions of 10° and −10° with reference to the front direction (A).

In an embodiment, when θ° is 20°, for example, the first side direction (B) and the second side direction (C) may have respective tilting directions of 20° and −20° with reference to the front direction (A).

In an embodiment, when θ° is 30°, for example, the first side direction (B) and the second side direction (C) may have respective tilting directions of 30° and −30° with reference to the front direction (A).

In an embodiment, when θ° is 40°, for example, the first side direction (B) and the second side direction (C) may have respective tilting directions of 40° and −40° with reference to the front direction (A).

In an embodiment, when θ° is 45°, for example, the first side direction (B) and the second side direction (C) may have respective tilting directions of 45° and −45° with reference to the front direction (A).

In an embodiment, when θ° is 50°, for example, the first side direction (B) and the second side direction (C) may have respective tilting directions of 50° and −50° with reference to the front direction (A).

In an embodiment, when θ° is 60°, for example, the first side direction (B) and the second side direction (C) may have respective tilting directions of 60° and −60° with reference to the front direction (A).

In general, since a viewing angle dependency may be larger in a direction that an observer is more tilted with reference to a front side, that is, that θ is larger, when the compensation film 10 satisfies Inequality 1 in a direction that θ° is 60°, which is the largest angle in Inequality 1, the compensation film 10 may be expected to also satisfy Inequality 1 even in a direction that θ° is less than about 60°.

The compensation film 10 satisfies Inequality 1 and thus may effectively decrease a color shift examined from a side direction and maintain a satisfactory compensation function even in the side direction.

Inequality 1 may have a narrower range and be, for example, represented by Inequality 1a.

$$1.00 \leq \frac{R_e(\theta°) + R_e(-\theta°)}{2R_e(0°)} \leq 1.16 \qquad \text{[Inequality 1a]}$$

In Inequality 1a, $R_e$ θ°, $R_e$(θ°), and $R_e$ (−θ°) are the same as those described above with reference to Inequality 1.

In an embodiment, in Inequalities 1 and 1a, $R_e$(θ°) and $R_e$(−θ°) may be different from each other. In other words, the in-plane retardations of the compensation film 10 in the first side direction (B) and in the second side direction (C) may be different and thus, may be asymmetrical in two symmetrical directions each other with a reference to the front direction (A), for example.

In an embodiment, the compensation film 10 may satisfy Inequality 3, for example.

$$|R_e(\theta°) - R_e(-\theta°)| > 10 \text{ nm} \qquad \text{[Inequality 3]}$$

In Inequality 3, $R_e$(θ°) and $R_e$(−θ°) are the same as described above.

According to Inequality 3, a difference between in-plane retardation in the first side direction (B) and in-plane retardation in the second side direction (C) of the compensation film 10 may be greater than 10 nm.

In an embodiment, the compensation film 10 may satisfy, for example, Inequality 3a.

$$|R_e(\theta°) - R_e(-\theta°)| \geq 20 \text{ nm} \qquad \text{[Inequality 3a]}$$

According to Inequality 3a, a difference between in-plane retardation in the first side direction (B) and in-plane retardation in the second side direction (C) of the compensation film 10 may be greater than or equal to about 20 nm.

In an embodiment, the compensation film 10 may satisfy, for example, Inequality 3b, for example.

$$|R_e(\theta°) - R_e(-\theta°)| \geq 30 \text{ nm} \qquad \text{[Inequality 3b]}$$

According to Inequality 3b, a difference between in-plane retardation in the first side direction (B) and in-plane retardation in the second side direction (C) of the compensation film 10 may be greater than or equal to about 30 nm.

In an embodiment, the compensation film 10 may satisfy, for example, Inequality 3c.

$$|R_e(\theta°) - R_e(-\theta°)| \geq 50 \text{ nm} \quad \text{[Inequality 3c]}$$

According to Inequality 3c, a difference between in-plane retardation in the first side direction (B) and in-plane retardation in the second side direction (C) of the compensation film 10 may be greater than or equal to about 50 nm.

In an embodiment, the compensation film 10 may satisfy, for example, Inequality 3d or 3e, for example.

$$\frac{R_e(\theta°)}{2} \geq R_e(-\theta°) \quad \text{[Inequality 3d]}$$

$$\frac{R_e(-\theta°)}{2} \geq R_e(\theta°) \quad \text{[Inequality 3e]}$$

According to Inequalities 3d and 3e, in-plane retardation in the first side direction (B) of the compensation film 10 may be twice or higher than in-plane retardation in the second side direction (C) or in-plane retardation in the second side direction (C) of the compensation film 10 may be twice or higher than in-plane retardation in the first side direction (B).

The compensation film 10 may have different in-plane retardations with regard to a wavelength of incident light and may be optically designed to have a larger in-plane retardation at a longer wavelength. In other words, in an embodiment, the compensation film 10 may have a larger in-plane retardation at a long wavelength than at a short wavelength, for example, an in-plane retardation satisfying Inequality 2 at wavelengths of 450 nm, 550 nm, and 650 nm.

$$R_e(450 \text{ nm}) < R_e(550 \text{ nm}) < R_e(650 \text{ nm}) \quad \text{[Inequality 2]}$$

In Inequality 2, $R_e$ (450 nm) is in-plane retardation of the compensation film 10 in a direction perpendicular to an optical axis of the compensation film 10 for incident light having a wavelength of 450 nm, $R_e$ (550 nm) is in-plane retardation of the compensation film 10 in a direction perpendicular to an optical axis of the compensation film 10 for incident light having a wavelength of 550 nm, and $R_e$ (650 nm) is in-plane retardation of the compensation film 10 in a direction perpendicular to an optical axis of the compensation film 10 for incident light having a wavelength of 650 nm.

The compensation film 10 has an in-plane retardation satisfying Inequality 2 and thus may realize circularly polarized light in all wavelength regions and minimize an antireflection and a color shift at a side well as in a front surface when applied to a post-described antireflective film.

In an embodiment, in-plane retardation of the compensation film 10 at wavelengths of 450 nm and 550 nm may satisfy Inequality 2a, for example.

$$0.70 \leq R_e(450 \text{ nm})/R_e(550 \text{ nm}) < 1.00 \quad \text{[Inequality 2a]}$$

In an embodiment, in-plane retardation of the compensation film 10 at wavelengths of 450 nm and 550 nm may satisfy Inequality 2a-1, for example.

$$0.72 \leq R_e(450 \text{ nm})/R_e(550 \text{ nm}) \leq 0.98 \quad \text{[Inequality 2a-1]}$$

In an embodiment, in-plane retardation of the compensation film 10 at wavelengths of 450 nm and 550 nm may satisfy Inequality 2a-2, for example.

$$0.75 \leq R_e(450 \text{ nm})/R_e(550 \text{ nm}) \leq 0.95 \quad \text{[Inequality 2a-2]}$$

In an embodiment, in-plane retardation of the compensation film 10 at wavelengths of 450 nm and 550 nm may satisfy Inequality 2a-3, for example.

$$0.78 \leq R_e(450 \text{ nm})/R_e(550 \text{ nm}) \leq 0.92 \quad \text{[Inequality 2a-3]}$$

In an embodiment, in-plane retardation of the compensation film 10 at wavelengths of 450 nm and 550 nm may satisfy Inequality 2a-4, for example.

$$0.80 \leq R_e(450 \text{ nm})/R_e(550 \text{ nm}) \leq 0.90 \quad \text{[Inequality 2a-4]}$$

In an embodiment, in-plane retardation of the compensation film 10 at wavelengths of 550 nm and 650 nm may satisfy Inequality 2b, for example.

$$1.0 < R_e(650 \text{ nm})/R_e(550 \text{ nm}) \leq 1.5 \quad \text{[Inequality 2b]}$$

In an embodiment, in-plane retardation of the compensation film 10 at wavelengths of 550 nm and 650 nm may satisfy Inequality 2b-1, for example.

$$1.00 < R_e(650 \text{ nm})/R_e(550 \text{ nm}) \leq 1.40 \quad \text{[Inequality 2b-1]}$$

In an embodiment, in-plane retardation of the compensation film 10 at wavelengths of 550 nm and 650 nm may satisfy Inequality 2b-2, for example.

$$1.00 < R_e(650 \text{ nm})/R_e(550 \text{ nm}) \leq 1.20 \quad \text{[Inequality 2b-2]}$$

In an embodiment, in-plane retardation of the compensation film 10 at wavelengths of 550 nm and 650 nm may satisfy Inequality 2b-3, for example.

$$1.00 < R_e(650 \text{ nm})/R_e(550 \text{ nm}) \leq 1.10 \quad \text{[Inequality 2b-3]}$$

The compensation film 10, as described above, includes a single optical anisotropic layer and accordingly, may satisfy an in-plane retardation having a predetermine relationship depending on an examination direction and a wavelength of incident light, and thus perform an effective compensation function in all wavelength regions and all examination directions. Accordingly, the compensation film 10 may be realized to be thin, since two or more compensation films do not need to be united, and thus prevent deviation of optical properties, a lamination error, and the like and thus deterioration of a compensation function, which could be caused by the two or more compensation films.

In an embodiment, a color shift measured in a 45° tilting side direction with reference to a front of the compensation film 10 may be less than or equal to about 6.0, for example.

In an embodiment, a color shift measured in a 45° tilting side direction with reference to a front of the compensation film 10 may be less than or equal to about 5.0, for example.

In an embodiment, a color shift measured in a 60° tilting side direction with reference to a front of the compensation film 10 may be less than or equal to about 6.0, for example.

In an embodiment, a color shift measured in a 60° tilting side direction with reference to a front of the compensation film 10 may be less than or equal to about 5.0, for example.

The compensation film 10 may be applied to an antireflective film.

Figure 3:
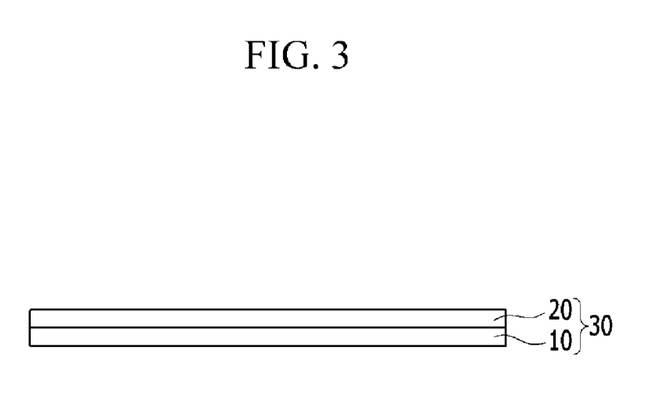
FIG. 3 is a cross-sectional view showing an antireflective film according to an embodiment.
Figure 4:
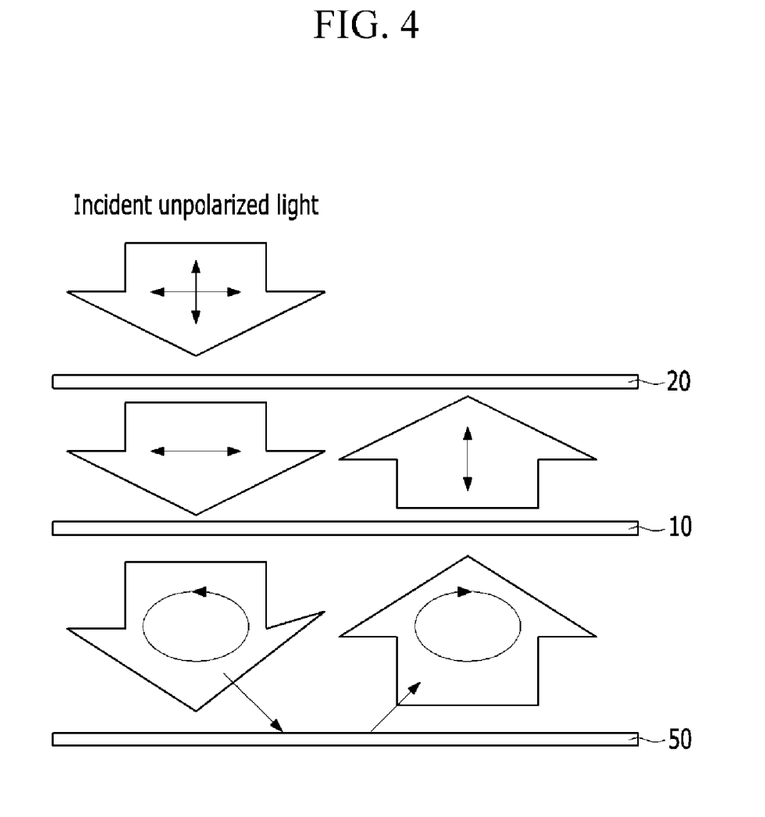
FIG. 4 is a cross-sectional view showing the external light anti-reflection principle of an antireflective film of FIG. 3.

FIG. 3 is a cross-sectional view showing an antireflective film according to an embodiment, and FIG. 4 is a cross-sectional view showing the external light anti-reflection principle of an antireflective film of FIG. 3.

Referring to FIG. 3, an antireflective film 30 according to an embodiment includes a polarizer 20 and a compensation film 10.

In an embodiment, the polarizer 20 and the compensation film 10 may, for example, directly contact each other or may be bonded by a coupling member such as an adhesive or a glue.

In an embodiment, the polarizer 20 may include, for example, elongated polyvinyl alcohol ("PVA") according to a method of, for example, drawing a polyvinyl alcohol film, adsorbing iodine or a dichroic dye to the polyvinyl alcohol film, and then treating the polyvinyl alcohol film with boric acid and washing the polyvinyl alcohol film.

In an embodiment, the polarizer 20 may be, for example, a polarizing film prepared by melt-blending a polymer resin and a dichroic dye, and the polarizing film may be, for example, provided by combining (e.g., mixing) a polymer and a dye and melting the combination (e.g., mixture) at a temperature above the melting point of the polymer resin to manufacture the polarizing film in a form of a sheet. In an embodiment, the polymer resin may be a hydrophobic polymer resin and may be, for example, polyolefin.

The compensation film 10 may be the same as the embodiments described above with reference to FIGS. 1 and 2, and therefore detailed descriptions may be omitted.

The polarizer 20 may linearly polarize incident light and the compensation film 10 may circularly polarize linearly polarized light that passes through the polarizer 20.

Referring to FIG. 4, while the incident unpolarized light (hereinafter referred to as 'external light') having entered from the outside passes through the polarizer 20, only a first polarized perpendicular component, which is one polarized perpendicular component of two polarized perpendicular components, is transmitted, and the polarized light is shifted into circularly polarized light by passing through the compensation film 10. While the circularly polarized light is reflected in a display panel 50 including a substrate, an electrode, and so on, and changes the circular polarization direction, and the circularly polarized light passes through the compensation film 10 again, only a second polarized perpendicular component, which is the other polarized perpendicular component of the two polarized perpendicular components, may be transmitted. As the second polarized perpendicular component is not passed through the polarizer 20, and light does not exit to the outside, effects of preventing the external light reflection may be provided.

In an embodiment, a color shift measured in a 45° tilting side direction with reference to a front of the antireflective film 30 may be less than or equal to about 6.0, for example.

In an embodiment, a color shift measured in a 45° tilting side direction with reference to a front of the antireflective film 30 may be less than or equal to about 5.0, for example.

In an embodiment, a color shift measured in a 60° tilting side direction with reference to a front of the antireflective film 30 may be less than or equal to about 6.0, for example.

In an embodiment, a color shift measured in a 60° tilting side direction with reference to a front of the antireflective film 30 may be less than or equal to about 5.0, for example.

The antireflective film 30 may further include a protective layer (not shown) on one surface of the polarizer 20. In an embodiment, the protective layer may be provided for further reinforcing the functionality or improving the durability of the antireflective film 30, or for reducing reflection or glare, and for example, may be a triacetyl cellulose ("TAC") film, for example, but is not limited thereto.

The antireflective film 30 may further include a correction layer (not shown). In an embodiment, the correction layer may be, for example, a color shift resistant layer, but is not limited thereto.

The antireflective film 30 may further include a light blocking layer (not shown) extended along the edge. The light-blocking layer may be extended along the circumference of the antireflective film 30. In an embodiment, the light-blocking layer may include an opaque material, for example, a black material. In an embodiment, the light-blocking layer may include a black ink, for example.

The antireflective film 30, as described above, include a single optical anisotropic layer and the compensation film 10 satisfying an in-plane retardation having a predetermined relationship depending on an examination direction and a wavelength of incident light and thus may perform an effective compensation function in all wavelength regions and all examination directions and further improve an antireflection function.

Accordingly, the compensation film may be realized to be thin, since two or more compensation films do not need to be united, and thus prevent deviation of optical properties, a lamination error, and the like and thus deterioration of a compensation function, which could be caused by the two or more compensation films.

The compensation film 10 or the antireflective film 30 may be applied to a display device.

Figure 5:
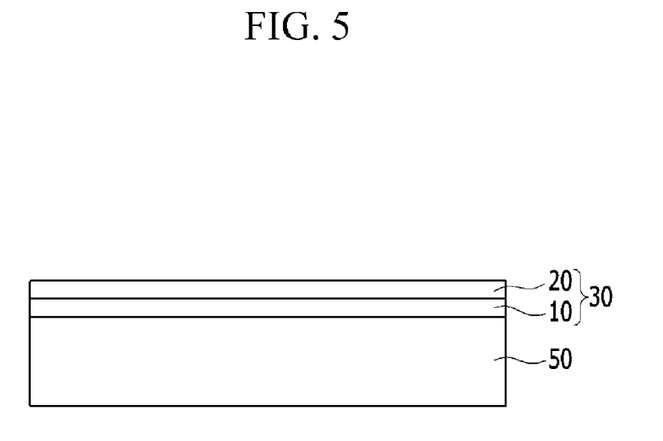
FIG. 5 is a cross-sectional view showing a display device according to an embodiment.

FIG. 5 is a cross-sectional view showing a display device according to an embodiment.

Referring to FIG. 5, a display device according to an embodiment includes a display panel 50 and an antireflective film 30.

In an embodiment, the display panel 50 may be, for example, a liquid crystal panel or an organic light emitting diode panel.

The antireflective film 30, as described above, includes the polarizer 20 and the compensation film 10 and may be disposed at an examiner's side.

The compensation film 10, as described above with FIGS. 1 to 4, includes a single optical anisotropic layer but may perform an effective compensation function in all wavelength regions and all examination directions. Accordingly, the compensation film may be realized to be thin, since two or more compensation films do not need to be united, and thus prevent deviation of optical properties, a lamination error, and the like and thus deterioration of a compensation function, which could be caused by the two or more compensation films. Accordingly, a liquid crystal display ("LCD") having a thinness and a wide viewing angle may be realized.

In an embodiment, a color shift measured in a 45° tilting side direction with reference to a front of the display device may be less than or equal to about 6.0, for example.

In an embodiment a color shift measured in a 45° tilting side direction with reference to a front of the display device may be less than or equal to about 5.0, for example.

In an embodiment, a color shift measured in a 60° tilting side direction with reference to a front of the display device may be less than or equal to about 6.0, for example.

In an embodiment, a color shift measured in a 60° tilting side direction with reference to a front of the display device may be less than or equal to about 5.0, for example.

Figure 6:
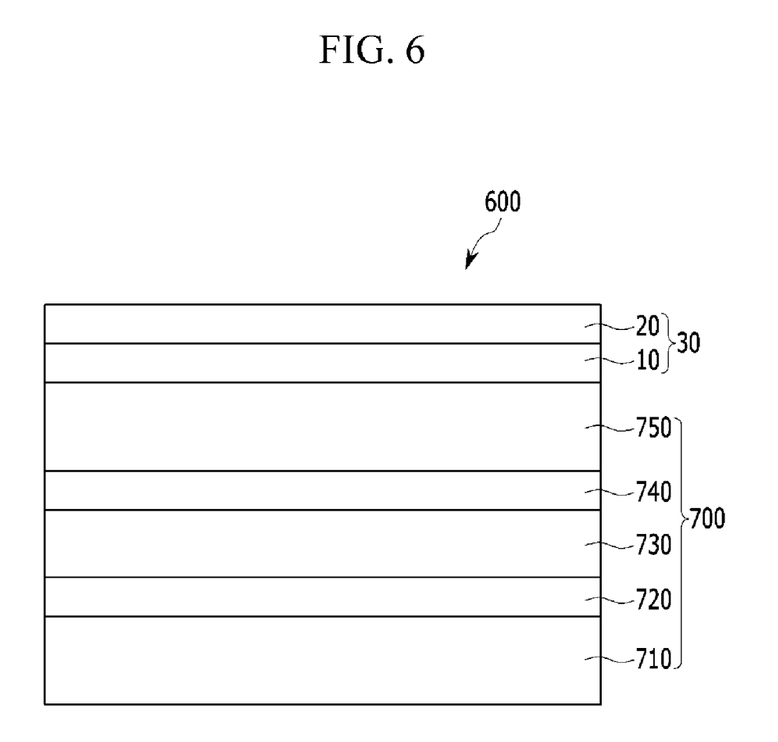
FIG. 6 is a cross-sectional view showing an organic light emitting diode ("OLED") display according to an embodiment.

FIG. 6 is a cross-sectional view showing an organic light emitting diode ("OLED") display according to an embodiment.

Referring to FIG. 6, an OLED display 600 according to an embodiment includes an OLED panel 700 and an antireflective film 30 disposed on one surface of the OLED panel 700.

The OLED panel 700 includes a base substrate 710, a lower electrode 720, an organic emission layer 730, an upper electrode 740, and an encapsulation substrate 750.

In an embodiment, the base substrate 710 may include glass or plastic, for example.

At least one of the lower electrode 720 and the upper electrode 740 may be an anode, and the other may be a cathode. The anode is an electrode into which holes are injected and may include a conductive material having a high work function, and the cathode is an electrode into which electrons are injected and may include a conductive material having a low work function. In an embodiment, at least one of the lower electrode 720 and the upper electrode 740 may include a transparent conductive material from which emitted light exits outside, for example, indium tin oxide ("ITO") or indium zinc oxide ("IZO").

The organic emission layer 730 includes an organic material which may emit light when applying a voltage to the lower electrode 720 and the upper electrode 740.

An auxiliary layer (not shown) may be further provided between the lower electrode 720 and the organic emission layer 730 and between the upper electrode 740 and the organic emission layer 730. The auxiliary layer may include a hole transporting layer, a hole injecting layer, an electron injecting layer, and an electron transporting layer in order to balance electrons and holes, but is not limited thereto.

In an embodiment, the encapsulation substrate 750 may include glass, metal, or a polymer, and may seal the lower electrode 720, the organic emission layer 730, and the upper electrode 740 to prevent moisture and/or oxygen inflow from the outside, for example.

The antireflective film 30 is the same as described and may be disposed at a light emitting side. In an embodiment, in the case of a bottom emission structure emitting light at the side of the base substrate 710, the optical film 100 may be disposed on the exterior side of the base substrate 710, while, in the case of a top emission structure emitting light at the side of the encapsulation substrate 750, the optical film 100 may be disposed on the exterior side of the encapsulation substrate 750.

The antireflective film 30 may prevent external light from being reflected by a metal such as an electrode of the OLED panel 700 and emitting outside of the OLED display, and thus improves display characteristics of the OLED display.

The antireflective film 30, as described above, includes a single optical anisotropic layer and the compensation film 10 satisfying an in-plane retardation having a predetermined relationship depending on an examination direction and a wavelength of incident light and thus may perform an effective function all wavelength regions and all examination directions and further improve an anti-reflection function. Accordingly, the compensation film may be realized to be thin, since two or more compensation films do not need to be united, and thus prevent deviation of optical properties, a lamination error, and the like and thus deterioration of a compensation function, which could be caused by the two or more compensation films. Accordingly, an OLED display having a thinness and a wide viewing angle may be realized.

Hereinafter, the embodiments are illustrated in more detail with reference to examples. However, these embodiments are exemplary, and the disclosure is not limited thereto.

Manufacture of Compensation Film

Preparation Example 1

A rubbed polyimide (LX-1400 EHC) alignment layer on a glass substrate is prepared. On the polyimide alignment layer, a liquid crystal layer is provided by spin-coating a liquid crystal solution in which two kinds of liquid crystals (RMM1594, Merck & Co., Inc./RMS03-011, Merck & Co., Inc.) in a ratio of 95:5 (wt:wt) are mixed in a mixed solvent of methyl isobutyl ketone and toluene (1:1 of a mol ratio), drying it on a hot plate at 120 degrees Celsius (° C.) for 5 minutes, and radiating ultraviolet ("UV") light (2000 miliJoules (mJ)) to obtain a compensation film.

Preparation Example 2

A compensation film is obtained according to the same method as Preparation Example 1 except for using the two kinds of liquid crystals in a ratio of 92:8 (wt:wt).

Preparation Example 3

A compensation film is obtained according to the same method as Preparation Example 1 except for using the two kinds of liquid crystals in a ratio of 90:10 (wt:wt).

Preparation Example 4

A compensation film is obtained according to the same method as Preparation Example 1 except for using a photo-alignment layer (HSPA-137, Nissan) for the alignment layer. The photo-alignment layer is provided by spin-coating a liquid crystal solution, drying it on a hot plate at 120° C. for 2 minutes, and radiating polarized UV light (50 mJ).

Preparation Example 5

A compensation film is obtained according to the same method as Preparation Example 2 except for using a photo-alignment layer (HSPA-137, Nissan) for the alignment layer.

Preparation Example 6

A compensation film is obtained according to the same method as Preparation Example 3 except for using a photo-alignment layer (HSPA-137, Nissan) for the alignment layer.

Comparative Preparation Example 1

A compensation film in which a λ/4 compensation film and a λ/2 compensation film are laminated (Dai Nippon Printing Co., Ltd.) is prepared.

Comparative Preparation Example 2

A λ/4 compensation film (WRS, Teijin Ltd.) is prepared.

Comparative Preparation Example 3

A compensation film is obtained according to the same method as Preparation Example 1 except for using a liquid crystal (RMM1594, Merck & Co., Inc.) and 0.5 wt % (based on 100 of the liquid crystal) of a surfactant (BYK 322, BYK-Chemie GmbH) to prepare the liquid crystal solution.

Comparative Preparation Example 4

A compensation film is obtained according to the same method as Preparation Example 1 except for using the two kinds of liquid crystals in a ratio of 80:20 (wt:wt).

Comparative Preparation Example 5

A compensation film is obtained according to the same method as Preparation Example 1 except for using a liquid crystal (RMS03-011, Merck & Co., Inc.) instead of the two kinds of liquid crystals.

Evaluation 1

In-plane retardations of the compensation films according to Preparation Examples 1 to 6 and Comparative Preparation Examples 1 to 5 are measured.

The in-plane retardations are measured by an Axoscan equipment (Axometrics Inc., USA) for light having a wavelength ranging from 400 nm to 700 nm by tilting the compensation film by every 10° from the front surface (0°) to a −60° to 60° side direction, that is, at each tilting direction of ±10°, ±20°, ±30°, ±40°, ±50°, and ±60°.

The in-plane retardations of the compensation films for light having a wavelength of 550 nm are shown in Tables 1 to 6, and each ratio of the in-plane retardations relative to their in-plane retardations at 450 nm, 550 nm, and 650 nm, that is, wavelength dispersions of the in-plane retardations is shown in Table 7.

TABLE 1

| | The number of layer of liquid crystal layer | $R_e$ (0°)* (nm) | $R_e$ (10°)** (nm) | $R_e$ (−10°)*** (nm) | EQ1 (10)**** |
|---|---|---|---|---|---|
| Preparation Example 1 | 1 | 135.6 | 151.5 | 121.4 | 1.01 |
| Preparation Example 2 | 1 | 139.2 | 158.2 | 121.3 | 1.00 |
| Preparation Example 3 | 1 | 137.8 | 158.3 | 119.6 | 1.01 |
| Preparation Example 4 | 1 | 133.2 | 147.5 | 119.9 | 1.06 |
| Preparation Example 5 | 1 | 134.3 | 152.8 | 117.0 | 1.00 |
| Preparation Example 6 | 1 | 136.0 | 156.7 | 116.2 | 1.00 |
| Comparison Preparation Example 4 | 1 | 139.4 | 159.0 | 125.6 | 1.02 |
| Comparison Preparation Example 5 | 1 | 132.6 | 150.9 | 115.1 | 1.00 |

*$R_e$ (0°) in-plane retardation measured at fronts of the compensation films (@ 550 nm)
**$R_e$ (10°) in-plane retardation in a 10° tilting direction with reference to fronts of the compensation film (@ 550 nm)
***$R_e$ (−10°) in-plane retardation in a −10° tilting direction with reference to fronts of the compensation film (@ 550 nm)
****$EQ1(10) = \dfrac{R_e(10°) + R_e(-10°)}{2R_e(0°)}$

TABLE 2

| | The number of layer of liquid crystal layer | $R_e$ (0°)* (nm) | $R_e$ (20°)** (nm) | $R_e$ (−20°)*** (nm) | EQ1 (20)**** |
|---|---|---|---|---|---|
| Preparation Example 1 | 1 | 135.6 | 166.6 | 108.4 | 1.01 |
| Preparation Example 2 | 1 | 139.2 | 177.9 | 105.3 | 1.02 |
| Preparation Example 3 | 1 | 137.8 | 176.7 | 100.6 | 1.01 |
| Preparation Example 4 | 1 | 133.2 | 162.4 | 107.5 | 1.00 |
| Preparation Example 5 | 1 | 134.3 | 171.9 | 101.5 | 1.02 |
| Preparation Example 6 | 1 | 136.0 | 180.6 | 100.4 | 1.03 |
| Comparison Preparation Example 4 | 1 | 139.4 | 179.4 | 111.1 | 1.04 |
| Comparison Preparation Example 5 | 1 | 132.6 | 170.0 | 99.4 | 1.01 |

*$R_e$ (0°) in-plane retardation measured at fronts of the compensation films (@ 550 nm)
**$R_e$ (20°) in-plane retardation in a 20° tilting direction with reference to fronts of the compensation film (@ 550 nm)
***$R_e$ (−20°) in-plane retardation in a −20° tilting direction with reference to fronts of the compensation film (@ 550 nm)
****$EQ1(20) = \dfrac{R_e(20°) + R_e(-20°)}{2R_e(0°)}$

TABLE 3

| | The number of layer of liquid crystal layer | $R_e$ (0°)* (nm) | $R_e$ (30°)** (nm) | $R_e$ (−30°)*** (nm) | EQ1 (30)**** |
|---|---|---|---|---|---|
| Preparation Example 1 | 1 | 135.6 | 179.8 | 97.0 | 1.02 |
| Preparation Example 2 | 1 | 139.2 | 197.9 | 91.6 | 1.04 |
| Preparation Example 3 | 1 | 137.8 | 198.3 | 86.6 | 1.03 |
| Preparation Example 4 | 1 | 133.2 | 177.3 | 107.5 | 1.01 |
| Preparation Example 5 | 1 | 134.3 | 191.1 | 88.1 | 1.03 |
| Preparation Example 6 | 1 | 136.0 | 200.5 | 83.9 | 1.05 |
| Comparative Preparation Example 4 | 1 | 139.4 | 202.6 | 96.7 | 1.07 |
| Comparative Preparation Example 5 | 1 | 132.6 | 188.7 | 85.3 | 1.03 |

*$R_e$ (0°) in-plane retardation measured at fronts of the compensation films (@ 550 nm)
**$R_e$ (30°) in-plane retardation in a 30° tilting direction with reference to fronts of the compensation film (@ 550 nm)
***$R_e$ (−30°) in-plane retardation in a −30° tilting direction with reference to fronts of the compensation film (@ 550 nm)
****$EQ1(30) = \dfrac{R_e(30°) + R_e(-30°)}{2R_e(0°)}$

TABLE 4

| | The number of layer of liquid crystal layer | $R_e$ (0°)* (nm) | $R_e$ (40°)** (nm) | $R_e$ (−40°)*** (nm) | EQ1 (40)**** |
|---|---|---|---|---|---|
| Preparation Example 1 | 1 | 135.6 | 189.3 | 89.6 | 1.03 |
| Preparation Example 2 | 1 | 139.2 | 217.3 | 80.6 | 1.07 |
| Preparation Example 3 | 1 | 137.8 | 215.5 | 72.6 | 1.05 |
| Preparation Example 4 | 1 | 133.2 | 191.5 | 96.2 | 1.03 |
| Preparation Example 5 | 1 | 134.3 | 209.9 | 77.4 | 1.07 |
| Preparation Example 6 | 1 | 136.0 | 223.3 | 73.6 | 1.09 |

TABLE 4-continued

| | The number of layer of liquid crystal layer | $R_e$ (0°)* (nm) | $R_e$ (40°)** (nm) | $R_e$ (-40°)*** (nm) | EQ1 (40)**** |
|---|---|---|---|---|---|
| Comparative Preparation Example 1 | 2 | 147.0 | 128.3 | 128.0 | 0.87 |
| Comparative Preparation Example 4 | 1 | 139.4 | 228.9 | 83.4 | 1.12 |
| Comparative Preparation Example 5 | 1 | 132.6 | 202.0 | 69.2 | 1.02 |

*$R_e$ (0°) in-plane retardation measured at fronts of the compensation films (@ 550 nm)

**$R_e$ (40°) in-plane retardation in a 40° tilting direction with reference to fronts of the compensation film (@ 550 nm)

***$R_e$ (-40°) in-plane retardation in a -40° tilting direction with reference to fronts of the compensation film (@ 550 nm)

****$$EQ1(40) = \frac{R_e(40°) + R_e(-40°)}{2R_e(0°)}$$

TABLE 5

| | The number of layer of liquid crystal layer | $R_e$ (0°)* (nm) | $R_e$ (50°)** (nm) | $R_e$ (-50°)*** (nm) | EQ1 (50)**** |
|---|---|---|---|---|---|
| Preparation Example 1 | 1 | 135.6 | 194.2 | 87.6 | 1.04 |
| Preparation Example 2 | 1 | 139.2 | 236.0 | 72.4 | 1.11 |
| Preparation Example 3 | 1 | 137.8 | 235.4 | 65.4 | 1.09 |
| Preparation Example 4 | 1 | 133.2 | 202.2 | 87.2 | 1.05 |
| Preparation Example 5 | 1 | 134.3 | 227.5 | 69.5 | 1.1 |
| Preparation Example 6 | 1 | 136.0 | 242.8 | 63.6 | 1.13 |
| Comparative Preparation Example 1 | 2 | 147.0 | 116.2 | 115.9 | 0.79 |
| Comparative Preparation Example 2 | 1 | 143.3 | 126.2 | 126.2 | 0.88 |
| Comparative Preparation Example 3 | 1 | 140.4 | 163.1 | 87.8 | 0.89 |
| Comparative Preparation Example 4 | 1 | 139.4 | 256.2 | 71.3 | 1.17 |
| Comparative Preparation Example 5 | 1 | 132.6 | 216.8 | 58.2 | 1.03 |

*$R_e$ (0°) in-plane retardation measured at fronts of the compensation films (@ 550 nm)

**$R_e$ (50°) in-plane retardation in a 50° tilting direction with reference to fronts of the compensation film (@ 550 nm)

***$R_e$ (-50°) in-plane retardation in a -50° tilting direction with reference to fronts of the compensation film (@ 550 nm)

****$$EQ1(50) = \frac{R_e(50°) + R_e(-50°)}{2R_e(0°)}$$

TABLE 6

| | The number of layer of liquid crystal layer | $R_e$ (0°)* (nm) | $R_e$ (60°)** (nm) | $R_e$ (-60°)*** (nm) | EQ1 (60)**** |
|---|---|---|---|---|---|
| Preparation Example 1 | 1 | 135.6 | 183.7 | 88.5 | 1.00 |
| Preparation Example 2 | 1 | 139.2 | 253.7 | 67.3 | 1.16 |
| Preparation Example 3 | 1 | 137.8 | 251.9 | 59.8 | 1.13 |
| Preparation Example 4 | 1 | 133.2 | 202.2 | 81.6 | 1.06 |
| Preparation Example 5 | 1 | 134.3 | 243.3 | 64.2 | 1.14 |
| Preparation Example 6 | 1 | 136.0 | 257.9 | 56.6 | 1.15 |
| Comparative Preparation Example 1 | 2 | 147.0 | 104.6 | 104.4 | 0.71 |
| Comparative Preparation Example 2 | 1 | 143.3 | 121.0 | 121.1 | 0.84 |
| Comparative Preparation Example 3 | 1 | 140.4 | 159.4 | 92.7 | 0.89 |
| Comparative Preparation Example 4 | 1 | 139.4 | 280.6 | 61.1 | 1.23 |
| Comparative Preparation Example 5 | 1 | 132.6 | 232.3 | 52.8 | 1.07 |

*$R_e$ (0°) in-plane retardation measured at fronts of the compensation films (@ 550 nm)

**$R_e$ (60°) in-plane retardation in a 60° tilting direction with reference to fronts of the compensation film (@ 550 nm)

***$R_e$ (-60°) in-plane retardation in a -60° tilting direction with reference to fronts of the compensation film (@ 550 nm)

****$$EQ1(60) = \frac{R_e(60°) + R_e(-60°)}{2R_e(0°)}$$

TABLE 7

| | $R_e$ (450 nm)/ $R_e$ (550 nm) | $R_e$ (650 nm)/ $R_e$ (550 nm) |
|---|---|---|
| Preparation Example 1 | 0.84 | 1.04 |
| Preparation Example 2 | 0.88 | 1.02 |
| Preparation Example 3 | 0.89 | 1.02 |
| Preparation Example 4 | 0.84 | 1.04 |
| Preparation Example 5 | 0.88 | 1.02 |
| Preparation Example 6 | 0.89 | 1.02 |
| Comparative Preparation Example 1 | 0.78 | 1.10 |
| Comparative Preparation Example 2 | 0.91 | 1.03 |
| Comparative Preparation Example 3 | 0.86 | 1.03 |
| Comparative Preparation Example 4 | 0.93 | 0.99 |
| Comparative Preparation Example 5 | 1.10 | 0.98 |

* $R_e$ (450 nm): in-plane retardation measured at fronts of the compensation films (@ 450 nm)
* $R_e$ (550 nm): in-plane retardation measured at fronts of the compensation films (@ 550 nm)
* $R_e$ (650 nm): in-plane retardation measured at fronts of the compensation films (@ 650 nm)

Manufacture of Antireflective Film

Example 1

An antireflective film is manufactured by attaching a polarization film (Samsung SDI Co., Ltd.) on one surface of the compensation film according to Preparation Example 1.

Example 2

An antireflective film is manufactured by attaching a polarization film (Samsung SDI Co., Ltd.) on one surface of the compensation film according to Preparation Example 2.

Example 3

An antireflective film is manufactured by attaching a polarization film (Samsung SDI Co., Ltd.) on one surface of the compensation film according to Preparation Example 3.

Example 4

An antireflective film is manufactured by attaching a polarization film (Samsung SDI Co., Ltd.) on one surface of the compensation film according to Preparation Example 4.

Example 5

An antireflective film is manufactured by attaching a polarization film (Samsung SDI Co., Ltd.) on one surface of the compensation film according to Preparation Example 5.

Example 6

An antireflective film is manufactured by attaching a polarization film (Samsung SDI Co., Ltd.) on one surface of the compensation film according to Preparation Example 6.

Comparative Example 1

An antireflective film is manufactured by attaching a polarization film (Dai Nippon Printing Co., Ltd.) on one surface of the compensation film according to Comparative Preparation Example 1.

Comparative Example 2

An antireflective film is manufactured by attaching a polarization film (Samsung SDI Co., Ltd.) on one surface of the compensation film according to Comparative Preparation Example 2.

Comparative Example 3

An antireflective film is manufactured by attaching a polarization film (Samsung SDI Co., Ltd.) on one surface of the compensation film according to Comparative Preparation Example 3.

Comparative Example 4

An antireflective film is manufactured by attaching a polarization film (Samsung SDI Co., Ltd.) on one surface of the compensation film according to Comparative Preparation Example 4.

Comparative Example 5

An antireflective film is manufactured by attaching a polarization film (Samsung SDI Co., Ltd.) on one surface of the compensation film according to Comparative Preparation Example 6.

Manufacture of OLED Device

Example 7

An OLED device is manufactured by attaching the antireflective film according to Example 1 to one surface of an organic light emitting panel (Galaxy S4 Panel, Samsung Display).

Example 8

An OLED device is manufactured by attaching the antireflective film according to Example 2 to one surface of an organic light emitting panel (Galaxy S4 Panel, Samsung Display).

Example 9

An OLED device is manufactured by attaching the antireflective film according to Example 3 to one surface of an organic light emitting panel (Galaxy S4 Panel, Samsung Display).

Example 10

An OLED device is manufactured by attaching the antireflective film according to Example 4 to one surface of an organic light emitting panel (Galaxy S4 Panel, Samsung Display).

Example 11

An OLED device is manufactured by attaching the antireflective film according to Example 5 to one surface of an organic light emitting panel (Galaxy S4 Panel, Samsung Display).

Example 12

An OLED device is manufactured by attaching the antireflective film according to Example 6 to one surface of an organic light emitting panel (Galaxy S4 Panel, Samsung Display).

Comparative Example 6

An OLED device is manufactured by attaching the antireflective film according to Comparative Example 1 to one surface of an organic light emitting panel (Galaxy S4 Panel, Samsung Display).

Comparative Example 7

An OLED device is manufactured by attaching the antireflective film according to Comparative Example 2 to one surface of an organic light emitting panel (Galaxy S4 Panel, Samsung Display).

Comparative Example 8

An OLED device is manufactured by attaching the antireflective film according to Comparative Example 3 to one surface of an organic light emitting panel (Galaxy S4 Panel, Samsung Display).

Comparative Example 9

An OLED device is manufactured by attaching the antireflective film according to Comparative Example 4 to one surface of an organic light emitting panel (Galaxy S4 Panel, Samsung Display).

Comparative Example 10

An OLED device is manufactured by attaching the antireflective film according to Comparative Example 5 to one surface of an organic light emitting panel (Galaxy S4 Panel, Samsung Display).
Evaluation 2

The OLED devices according to Examples 7 to 12 and Comparative Examples 6 to 10 are measured regarding a reflection color at a side direction of 45° and 60°.

The reflection color may be measured by a CIE-Lab color coordinator and expressed as $\Delta a^*b^* = \sqrt{a^{*2}+b^{*2}}$ where positive a* is red, negative a* is green, positive b* is yellow, negative b* is blue. As the a* and the b* have a larger absolute value, the reflection color is stronger, and an OLED device having a smaller reflection color may show a color tone close to black and a small color tone change, that is, secure satisfactory visibility by reflection of external light.

The reflection color is measured by DMS803 (Instrument Systems).

The results are shown in Table 8.

TABLE 8

|  | $\Delta a^*b^*$ (45°) | $\Delta a^*b^*$ (60°) |
| --- | --- | --- |
| Example 7 | 4.31 | 3.19 |
| Example 8 | 4.76 | 4.30 |
| Example 9 | 3.11 | 4.99 |
| Example 10 | 4.27 | 3.83 |
| Example 11 | 4.70 | 4.66 |
| Example 12 | 4.25 | 4.37 |
| Comparative Example 6 | 13.26 | 13.07 |
| Comparative Example 7 | 13.46 | 12.75 |
| Comparative Example 8 | 6.40 | 6.51 |
| Comparative Example 9 | 6.77 | 7.00 |
| Comparative Example 10 | 10.90 | 8.14 |

Referring to Table 8, the OLED displays according to Examples 7 to 12 show much lower reflection color than the OLED displays according to Comparative Examples 6 to 10. Specifically, the OLED displays according to Examples 7 to 12 respectively satisfy $\Delta a^*b^* \leq 6.0$ at a side direction of 45° and 60°. Accordingly, the OLED displays according to Examples 1 to 6 use a single-layered compensation film and thus may have a smaller thickness and secure satisfactory visibility in a side direction.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:
1. An antireflective film comprising:
a polarizer, and
a compensation film on one surface of the polarizer,
wherein the compensation film satisfies Inequalities 1 and 2, and
a color shift measured in a 60° tilting side direction with reference to a front of the antireflective film is less than or equal to about 6.0:

$$0.90 \leq \frac{R_e(\theta°) + R_e(-\theta°)}{2R_e(0°)} \leq 1.20 \quad \text{[Inequality 1]}$$

where, in Inequality 1,
$R_e$ (0°) is in-plane retardation of the compensation film in a direction perpendicular to an optical axis of the compensation film for incident light having a wavelength of 550 nanometers,
$R_e$ (θ°) and $R_e$ (-θ°) are in-plane retardation of the compensation film in respective tilting directions at θ° and -θ° with respect to the direction perpendicular to the optical axis of the compensation film for the incident light having the wavelength of 550 nanometers, wherein θ° ranges from about 10° to about 60°, and
$R_e$(θ°) and $R_e$(-θ°) are different, $$R_e(450\ nm) < R_e(550\ nm) < R_e(650\ nm) \quad \text{[Inequality 2]}$$

wherein, in Inequality 2,
$R_e$ (450 nm) is in-plane retardation of the compensation film in the direction perpendicular to the optical axis of the compensation film for incident light having a wavelength of 450 nanometers,
$R_e$ (550 nm) is in-plane retardation of the compensation film in the direction perpendicular to the optical axis of the compensation film for incident light having a wavelength of 550 nanometers, and
$R_e$ (650 nm) is in-plane retardation of the compensation film in a direction perpendicular to an optical axis of the compensation film for incident light having a wavelength of 650 nanometers.

2. The antireflective film of claim 1, wherein the compensation film satisfies Inequality 3:

$$|R_e(\theta°) - R_e(-\theta°)| > 10\ nm \quad \text{[Inequality 3]}$$

wherein, in Inequality 3,
$R_e$ (θ°) and $R_e$ (-θ°) are in-plane retardation of the compensation film in respective tilting directions at θ° and -θ° with respect to the direction perpendicular to the optical axis of the compensation film for the incident light having the wavelength of 550 nanometers, wherein θ° ranges from about 10° to about 60°.

3. The antireflective film of claim 1, wherein Inequality 1 is represented by Inequality 1a:

$$1.00 \leq \frac{R_e(\theta°) + R_e(-\theta°)}{2R_e(0°)} \leq 1.16 \quad \text{[Inequality 1a]}$$

wherein, in Inequality 1a,
$R_e$ (0°) is in-plane retardation of the compensation film in the direction perpendicular to the optical axis of the compensation film for the incident light having the wavelength of 550 nanometers,
$R_e$ (θ°) and $R_e$ (-θ°) are in-plane retardation of the compensation film in respective tilting directions at θ° and -θ° with respect to the direction perpendicular to the optical axis of the compensation film for the incident light having the wavelength of 550 nanometers, wherein θ° ranges from about 10° to about 60°, and
$R_e$ (θ°) and $R_e$ (-θ°) are different from each other.

4. The antireflective film of claim 1, wherein the in-plane retardation of the compensation film for the light having the wavelengths of 450 nanometers and 550 nanometers satisfies Inequality 2a:

$$0.7 \leq R_e(450\ nm)/R_e(550\ nm) < 1.0 \qquad \text{[Inequality 2a]}$$

wherein, in Inequality 2a, $R_e$ (450 nm) is in-plane retardation of the compensation film in the direction perpendicular to the optical axis of the compensation film for the incident light having the wavelength of 450 nanometers, and $R_e$ (550 nm) is in-plane retardation of the compensation film in the direction perpendicular to the optical axis of the compensation film for the incident light having the wavelength of 550 nanometers.

5. The antireflective film of claim 4, wherein the in-plane retardation of the compensation film for the light having the wavelengths of 550 nanometers and 650 nanometers satisfies Inequality 2b:

$$1.0 < R_e(650\ nm)/R_e(550\ nm) \leq 1.5 \qquad \text{[Inequality 2b]}$$

wherein, in Inequality 2b, $R_e$ (550 nm) is in-plane retardation of the compensation film in the direction perpendicular to the optical axis of the compensation film for the incident light having the wavelength of 550 nanometers, and $R_e$ (650 nm) is in-plane retardation of the compensation film in the direction perpendicular to the optical axis of the compensation film for the incident light having the wavelength of 650 nanometers.

6. The antireflective film of claim 1, wherein θ° of Inequality 1 ranges from about 45° to about 60°.

7. The antireflective film of claim 1, wherein $R_e$ (0°) ranges from about 120 nanometers to about 160 nanometers.

8. The antireflective film of claim 1, wherein the compensation film includes an optical anisotropic layer, and the optical anisotropic layer consists of one of a single liquid crystal layer and a single elongated polymer layer.

9. A display device comprising:

a display panel; and the antireflection film of claim 1 on one surface of the display panel.

10. The display device of claim 9, wherein the display panel is one of a liquid crystal panel and an organic light emitting diode panel.

* * * * *